(12) United States Patent
Yoo et al.

(10) Patent No.: US 7,994,013 B2
(45) Date of Patent: *Aug. 9, 2011

(54) SEMICONDUCTOR DEVICE AND METHOD OF FABRICATING THE SEMICONDUCTOR DEVICE

(75) Inventors: Jae Hyun Yoo, Inchon-si (KR); Jong Min Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 533 days.

This patent is subject to a terminal disclaimer.

(21) Appl. No.: 12/144,432

(22) Filed: Jun. 23, 2008

(65) Prior Publication Data

US 2008/0315306 A1 Dec. 25, 2008

(30) Foreign Application Priority Data

Jun. 25, 2007 (KR) .................. 10-2007-0062507

(51) Int. Cl.
*H01L 21/336* (2006.01)
(52) U.S. Cl. .................. 438/296; 25/E21.409
(58) Field of Classification Search .......... 438/296; 257/E21.409
See application file for complete search history.

(56) References Cited

U.S. PATENT DOCUMENTS

| 5,844,275 | A | 12/1998 | Kitamura et al. |
| 6,903,421 | B1 | 6/2005 | Huang et al. |
| 2002/0132406 | A1* | 9/2002 | Disney ........................... 438/197 |
| 2002/0137318 | A1* | 9/2002 | Peake et al. ................... 438/585 |
| 2008/0290411 | A1* | 11/2008 | Lee ............................... 257/343 |

FOREIGN PATENT DOCUMENTS

CN 1926690 A 3/2007

OTHER PUBLICATIONS

Huang Chih-Feng Yang; "Isolated High-Voltage LDMOS Transistor Having a Split Well Structure"; esp@cenet; Chinese Publication No. CN1926690 (A); Publication Date: Mar. 7, 2007; esp@cenet Database—Worldwide.
Partial Chinese Office Action date stamped Jul. 24, 2009; Chinese Patent Application No. 2008101248935; The State Intellectual Property Office of P.R.C., People's Republic of China.

* cited by examiner

*Primary Examiner* — Lex Malsawma
(74) *Attorney, Agent, or Firm* — The Law Offices of Andrew D. Fortney; Andrew D. Fortney; Anthony R. Jimenez

(57) ABSTRACT

A semiconductor device comprises a gate electrode on a semiconductor substrate, drift regions at opposite sides of the gate electrode, source and drain regions in the respective drift regions, and shallow trench isolation (STI) regions in the respective drift regions between the gate electrode and the source or drain region, wherein the drift regions comprise first and second conductivity-type impurities.

14 Claims, 5 Drawing Sheets

SEMICONDUCTOR DEVICE AND METHOD OF FABRICATING THE SEMICONDUCTOR DEVICE

CROSS-REFERENCE TO RELATED APPLICATIONS

The present application claims priority under 35 U.S.C. 119 and 35 U.S.C. 365 to Korean Patent Application No. 10-2007-0062507 (filed on Jun. 25, 2007), which is hereby incorporated by reference in its entirety.

BACKGROUND

The present disclosure relates to a semiconductor device and a method for fabricating the same.

Integrated circuits and other semiconductor devices are susceptible to being damaged by snapback phenomena, which can cause exposure of the device to a breakdown voltage. As semiconductor devices become smaller and more densely integrated the potential for device breakdown increases.

The problems presented by increased integration and miniaturization are particularly troublesome in high voltage devices, where reliable device performance must be maintained at a high voltage while reducing the size of the devices. Manufacturing processes capable of producing highly integrated high voltage semiconductor devices are needed.

In the high voltage device, a breakdown phenomenon may occur by a snapback phenomenon. That is, in a high voltage transistor, when a voltage applied to a drain is increased, electrons travel from a source to the drain, causing an impact ionization phenomenon under a gate electrode spacer near the drain.

When the impact ionization phenomenon occurs, holes travel from an area under the spacer near the drain to the substrate, which may cause a current flowing from the drain to the source to increase abruptly. This may cause a snapback phenomenon, which may, in turn, result in a breakdown voltage property.

SUMMARY

Embodiments provide a semiconductor device and a method for fabricating the same.

Embodiments of the present invention provide a semiconductor device having an improve breakdown voltage property and a method for fabricating the semiconductor device.

Embodiments also provide a semiconductor device that is designed to suppress generation of an impact ionization phenomenon and a method for fabricating the semiconductor device.

In one embodiment, a semiconductor device comprises a gate electrode on a semiconductor substrate, drift regions at both sides of the gate electrode, source and drain regions on opposite sides of the gate electrode from one another and in the respective drift regions, and shallow trench isolation (STI) regions on opposite sides of the gate electrode from one another and located within the respective drift regions and between the gate electrode and the source or drain region, wherein the drift regions are formed by implanting first and second conductive-type impurities into the semiconductor substrate adjacent to the gate.

In another embodiment, a method for fabricating a semiconductor device comprises forming a first impurity region by implanting first conductive-type impurities into a semiconductor substrate using a first energy; forming a second impurity region by implanting second conductive-type impurities into the semiconductor substrate using a second energy; forming a third impurity region by implanting the first conductive-type impurities into the semiconductor substrate using a third energy; forming a drift region by diffusing the first- and second-type impurities of the first, second, and third impurity regions by heat-treating the semiconductor substrate; forming a gate electrode on the semiconductor substrate, forming source and drain regions by heavily implanting the first conductive impurities into the drift region; and forming shallow trench isolation regions by selectively etching portions of the drift regions between a gate electrode and a drain region and a gate electrode and a source region filling the etched portion with an insulation material.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Figure 1:
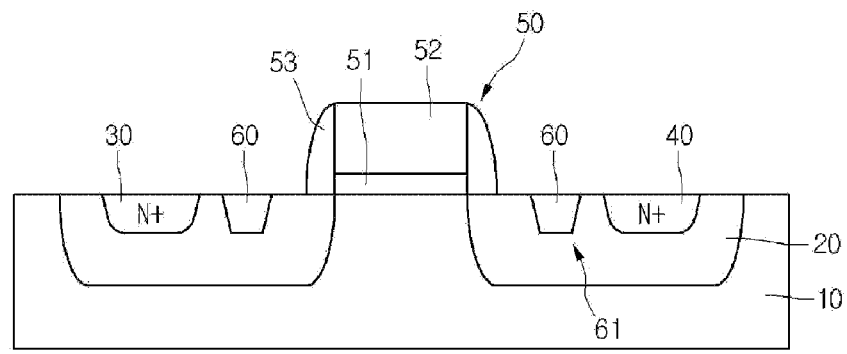
FIG. 1 is a view of a semiconductor device according to an exemplary embodiment of the present invention.

FIG. 1 is a view of a semiconductor device according to an exemplary embodiment.

Referring to FIG. 1, drift regions 20 are formed on a P-type semiconductor substrate 10. The drift regions 20 include a greater concentration of N-type impurities than P-type impurities. Source and drain regions 30 and 40 are heavily doped with the N-type impurities are formed in the drift regions 20.

A gate electrode 50 may be formed between the drift regions 20. The gate electrode 50 includes a gate dielectric 51 (e.g., thermal oxide), a gate poly 52, and a spacer 53 (e.g., silicon oxide and/or silicon nitride). The gate poly 52 may comprise or be composed of polysilicon, and may alternatively include a silicide layer at an upper surface of the gate poly 52 (e.g., Ti silicide, W silicide, Co silicide, Ni silicide, Pt silicide, etc.).

A shallow trench isolation (STI) region 60 formed by filling a trench with an insulation material may be present in the drift region 20 between the gate electrode 50 and the source region 30. Another STI region 60 formed by filling a trench with an insulation material may be present in the drift region 20 between the gate electrode 50 and the drain region 40. In each case, the insulation material may comprise a thermal oxide liner layer along the sidewalls and bottom of the trench, a thin silicon nitride layer thereon, and a bulk oxide layer (e.g., a silicon dioxide such as a TEOS- or plasma silane-based oxide).

The drift region 20 may reduce an intensity of an electric field between the gate electrode 50 and the drain region 40. The drift region 20 may be formed having a sufficient width to increase a gap between the gate electrode 50 and the drain region 40. However, increasing the gap between the gate electrode 50 and the drain region 40 serves to increase the size of the device, which is inconsistent with the general goals of miniaturization and integration (e.g., reducing the size of the semiconductor device). Additionally, the drift region 20 having such an increased width reduces a current between the gate and drain and increases a gate voltage. Therefore, there is a need to reduce the width of the drift region 20.

In this embodiment, the width of the drift region 20 is reduced and the STI regions 60 are formed in the drift region 20.

The STI regions 60 formed in the drift region 20 allow the width of the drift region 20 to be narrowed and the occurrence of impact ionization phenomenon by the drift region 20 can be reduced.

Meanwhile, when the gate electrode 50, source region 30, and semiconductor substrate 10 are in a grounded state, a breakdown voltage BV may be measured while increasing a voltage applied to the drain region 40 and an on-breakdown voltage BVon may be measured while increasing a voltage applied to the drain region 40 to determine a safe operating area (SOA), a property of a power device.

A trade off phenomenon occurs between the BV and BVon properties in accordance with a doping profile of the drift region 20.

In one embodiment, the BV property and the BVon property are independently controlled. That is, the BV property may be uniformly maintained by maintaining a uniform doping concentration of the drift region 20, and the BVon property is improved by varying a doping profile of the drift region 20.

Figure 2:
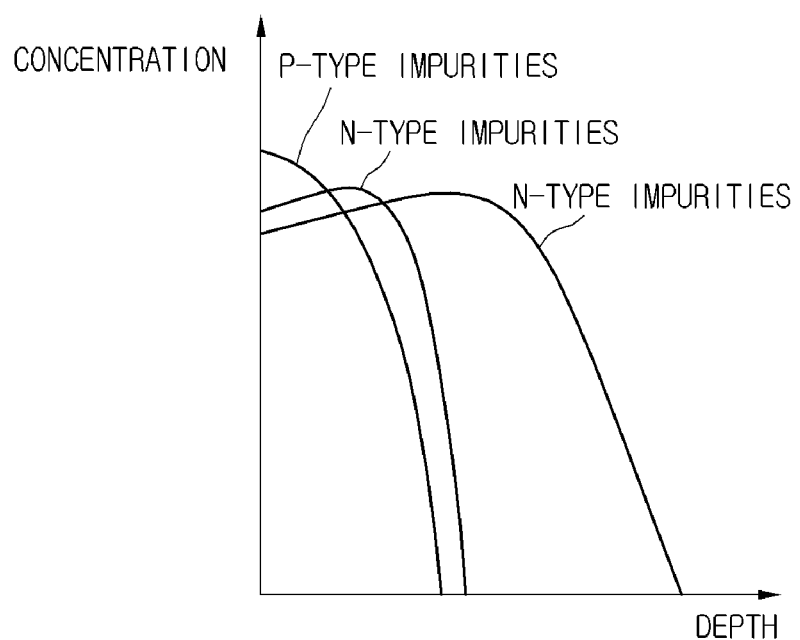
FIG. 2 is a view illustrating doping profiles of the first, second, and third impurity regions within a drift region of a semiconductor device according to an exemplary embodiment, wherein the horizontal axis represents a range of depths in the drift region and the vertical axis represents a range of dopant concentrations.

FIG. 2 is a view illustrating a doping profile of the drift region in the semiconductor device according to an exemplary embodiment.

FIG. 2 shows impurity doping distributions in the drift regions 20, including dopant profile curves for the N-type and P-type impurities implanted in each of the first, second, and third impurity implants performed in forming the drift regions 20. The graph represents dopant concentrations (y-axis) along a depth direction of the semiconductor substrate 10 at the STI region 60 (x-axis). The doping profile is designed such that an amount of the P-type impurities gradually decreases as a function of the depth from interface of the drift region 20 with the bottom surface of the STI region 60, such that an amount of the P-type impurities may gradually increase and then decrease, or such that an amount of the P-type impurities may be gradually increased and again reduced.

In one embodiment, since the injection process of the N-type impurities is performed through two steps, the N-type impurities are illustrated as separate doping concentration profiles in FIG. 2.

The doping profile will be more easily understood in the following description of a method for fabricating the semiconductor device.

Meanwhile, in a similar semiconductor device having the drift region 20 in which the STI region 60 is formed, but which does not have a dopant distribution as described above and as shown in FIG. 2 (specifically, a semiconductor device lacking a P-type impurity region below the STI region 60), the strongest electric field would be formed on a bottom surface 61 of the STI 60 near the drain region. When voltage is applied to the drain region 40 in such a device, the electrons travel from the source region 30 to the drain region 40 via the lower portion of the STI region 60, which may cause an impact ionization phenomenon on the bottom surface 61 of the STI region 60 near the drain region.

In an exemplary semiconductor device, the doping profile of the drift region 20 as shown in FIG. 2 disperses the traveling path of electrons between the source region 30 and drain region 40 away from the lower portion (i.e., bottom surface 61) of the STI region 60 in the depth direction. Thus, the impact ionization phenomenon and the snapback phenomenon can be prevented.

FIGS. 3 to 8 are views illustrating a method for fabricating a semiconductor device according to an exemplary embodiment.

Figure 3:
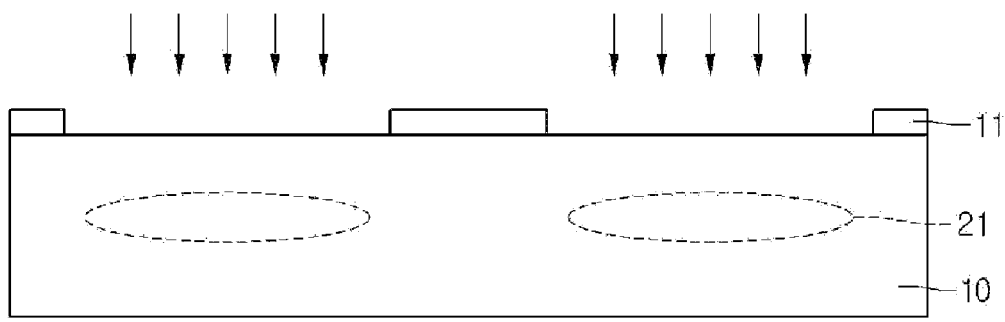
FIG. 3 is a view according to an exemplary embodiment illustrating the steps of forming a mask layer 11 over a semiconductor substrate 10 for forming a first impurities region 21, and implanting first-type impurities into exposed areas of the semiconductor substrate 10 to form first impurities region 21.

Referring to FIG. 3, a mask layer 11 is formed by depositing and patterning a mask material (e.g., photoresist) on a semiconductor substrate 10 (e.g., P-type silicon). N-type impurities are then implanted using a first energy and mask layer 11 as a mask to form a first impurities region 21.

Figure 4:
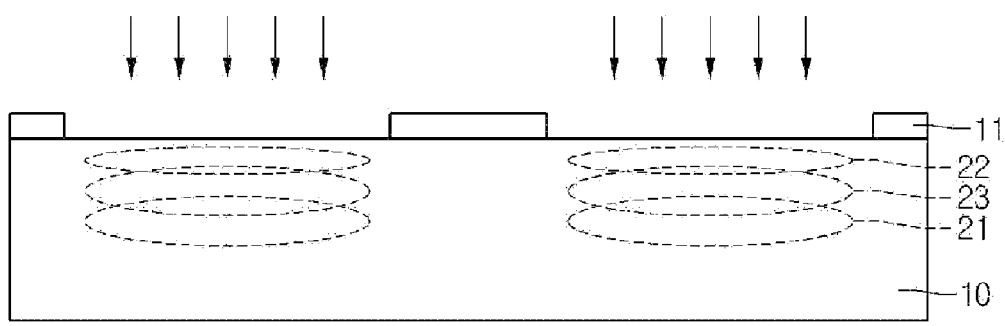
FIG. 4 is a view according to an exemplary embodiment illustrating the steps of forming a second impurities region 22 by implanting second-type impurities into the exposed areas of the semiconductor substrate 10 using mask layer 11 as a mask, and forming a third impurities region 23 by implanting first-type impurities into the exposed areas of the semiconductor substrate 10 using mask layer 11 as a mask.

Referring to FIG. 4, P-type impurities are implanted using the mask layer 11 as a mask and a second energy to form a second impurity region 23.

Then N-type impurities are implanted using a third energy by an amount similar to that of the P-type impurities (e.g., a similar concentration) to form a third impurity region 23.

The first energy is highest while the second energy is lowest. The third energy is between the first and second energies.

In an exemplary embodiment, the first impurity region 21 is formed using the first energy. At this point, the P-type impurities implanted using the second energy is implanted by a same amount (a same concentration) as the N-type impurities that are implanted using the third energy.

Therefore, the BV property is not varied by the P-type impurities that are implanted using the second energy and the N-type impurities that are implanted using the third energy.

However, the second impurity region 22 implanted with the P-type impurities are formed around a surface of the semiconductor substrate 10 and the first and third impurity regions 21 and 23 that are implanted with the N-type impurities are formed under the second impurity region 22. Therefore, the flowing path of the drain current may be shifted in the depth direction of the semiconductor substrate 10 along the first and third impurity regions 21 and 23 that are implanted with the N-type impurities.

Therefore, the moving path of the electrons may be separated from the portion where the electric field is strongly formed, the impact ionization phenomenon is prevented and thus the BVon property can be enhanced.

Figure 5:
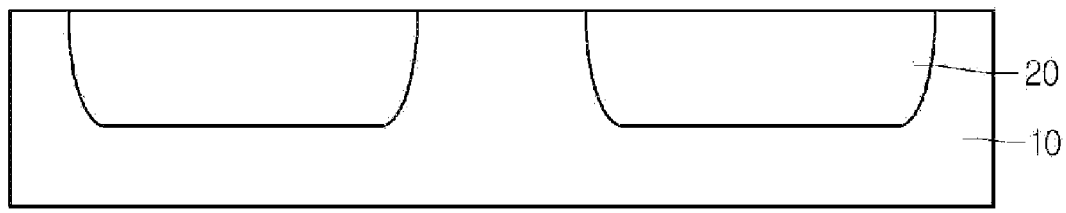
FIG. 5 is a view according to an exemplary embodiment illustrating the step of diffusing the first- and second-type impurities of the first, second, and third impurity regions 21, 22, and 23 by heating the substrate to form drift regions 20.

Referring to FIG. 5, mask layer 11 is removed and impurities contained in the first, second, and third impurity regions 21, 22, and 23 are diffused by heat-treating the semiconductor substrate.

Figure 6:
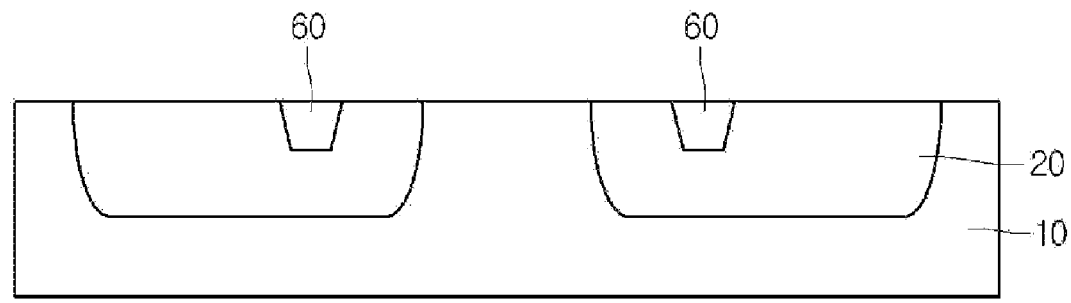
FIG. 6 is a view according to an exemplary embodiment illustrating the step of removing portions of the semiconductor substrate 10 in the drift regions 20 to form shallow trenches, and filling the trenches with insulation material to form shallow trench isolation regions 60.

Referring to FIG. 6, a portion of the semiconductor substrate 10 in each of the drift regions 20 is removed by etching the semiconductor substrate (e.g., anisotropic etching) to form trenches for shallow trench isolation structures. An insulation material may then be filled into the trenches, thereby forming the STI regions 60. The insulation material may be a silicon oxide material, which may be deposited by chemical vapor deposition (CVD).

Figure 7:
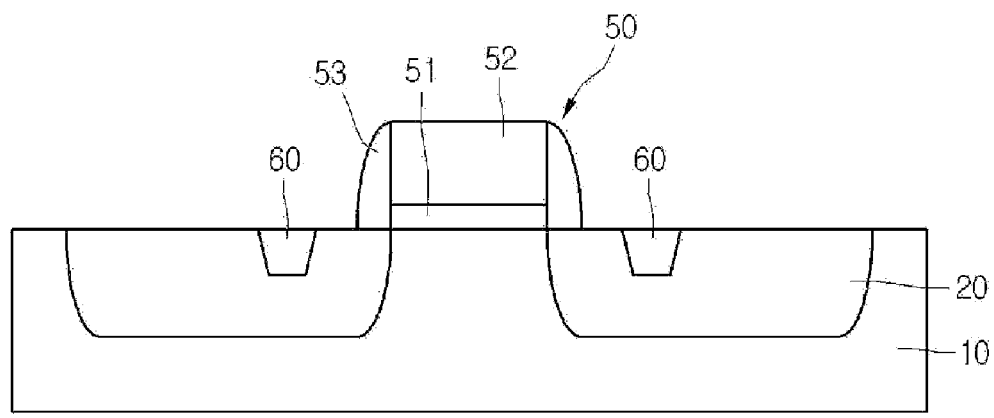
FIG. 7 is a view according to an exemplary embodiment illustrating the step of forming a gate electrode 50 between the drift regions 20, which includes forming a gate insulation layer 51, a gate poly layer 52, and gate spacers 53.

Referring to FIG. 7, a gate electrode 50 including a gate insulation layer 51 (e.g., a gate oxide layer), a gate poly 52, and spacers 53 (e.g., silicon oxide and/or silicon nitride spacers) may be formed between the drift regions 20. The gate insulation layer 51 and the gate poly 52 may be formed by thermal oxidation of the semiconductor substrate 10 to form a thermal oxide layer, depositing a polysilicon layer by a CVD process (e.g., Low Pressure CVD, High Density Plasma CVD, or Plasma Enhanced CVD) over the thermal oxide layer, and patterning the polysilicon layer and the thermal oxide (e.g., by a photolithography process) to form the gate poly 52 and the gate insulation layer 51, respectively.

Figure 8:
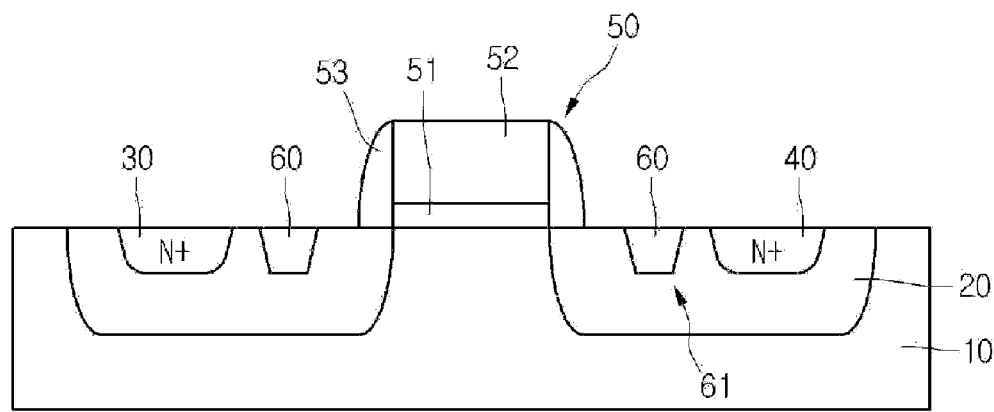
FIG. 8 is a view according to an exemplary embodiment illustrating the step of implanting first-type impurities at a high concentration into the drift regions 20 on opposite sides of the shallow trench isolation regions 60 from the gate electrode 50 to form source region 30 and drain region 40.

Referring to FIG. 8, N-type impurities are heavily implanted into portions of the drift regions 20 that are on opposite sides of the STI regions 60 from the gate electrode 50 to form source and drain regions 30 and 40 in the respective drift regions 20.

Figure 9:
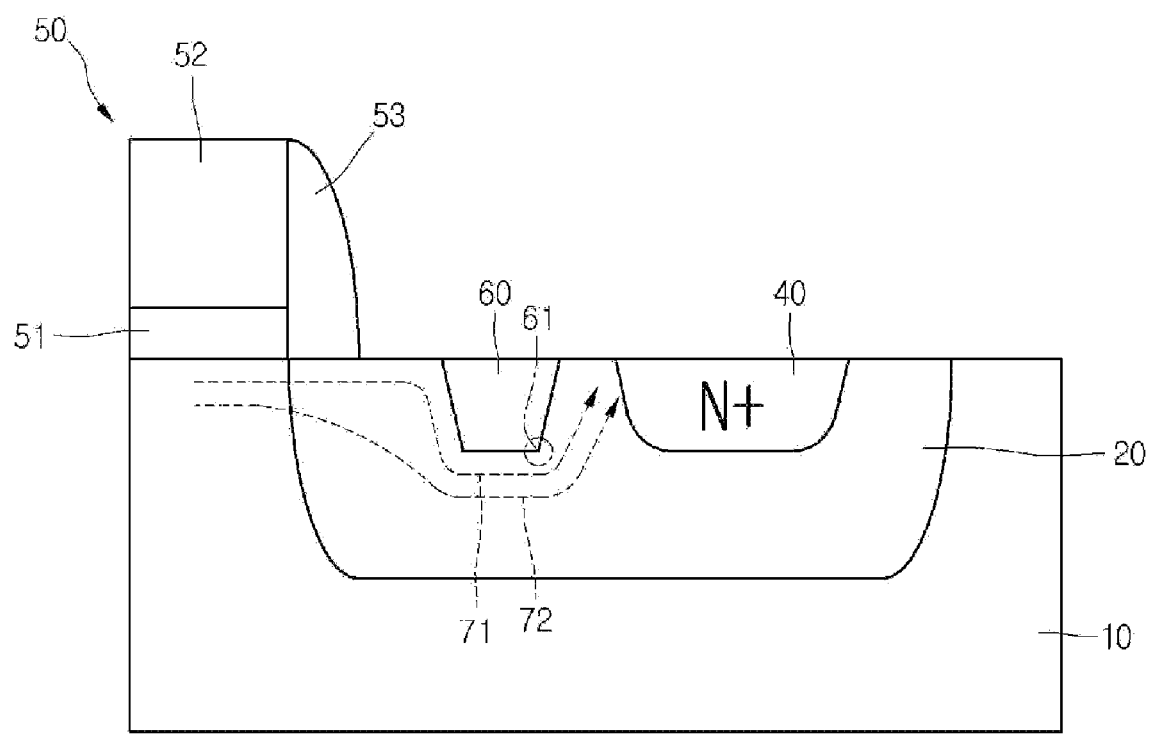
FIG. 9 is a view illustrating a flow of electrons traveling from a source region to a drain region in a semiconductor device according to an exemplary embodiment.

FIG. 9 is a view illustrating a flow of electrons traveling from a source region to a drain region in a semiconductor device according to an exemplary embodiment.

When the drift regions 20 are formed by implanting only the N-type impurities, the bottom surface of the STI region having the strongest electric field coincides with the traveling path of the electrons, thereby generating the impact ionization phenomenon.

When the drift regions 20 are formed by implanting both the N-type and P-type impurities, the electron traveling path may be shifted in the depth direction of the semiconductor substrate 10. Therefore, the bottom surface 61 of the STI region near the drain region and the traveling path of the electrons may be separated from each other, thereby reducing the impact ionization phenomenon.

According to the embodiments of the present invention, the semiconductor device is improved in the breakdown voltage property.

In addition, an impact ionization phenomenon can be avoided in the presently described semiconductor devices.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a semiconductor device, comprising:
   forming a first impurity region by implanting first conductive impurities having a first conductivity type into a semiconductor substrate at a first energy;
   forming a second impurity region by implanting second conductive impurities having a second conductivity type into the semiconductor substrate at a second energy;
   forming a third impurity region by implanting third conductive impurities having the first conductivity type into the semiconductor substrate at a third energy;
   forming a drift region by diffusing the first, second, and third impurity regions;
   forming a gate electrode on the semiconductor substrate;
   forming source and drain regions by heavily implanting fourth conductive impurities having the first conductivity type into the drift region; and
   forming a shallow trench isolation region by selectively etching a portion of the drift region between the gate electrode and the source region or the drain region and filling the etched portion with an insulation material.

2. The method according to claim 1, wherein the first energy is higher than the second and third energies, and the third energy is higher than the second energy.

3. The method according to claim 1, wherein a concentration of the second conductive impurities gradually reduces as a depth under the shallow trench isolation region increases.

4. The method according to claim 1, wherein a concentration of the first conductive impurities gradually increases and then reduces as a depth under the shallow trench isolation region increases.

5. The method according to claim 1, wherein a plurality of electron paths in the drift regions form at a location of a strongest electric field.

6. The method according to claim 1, wherein an amount of the first conductive impurities is greater than that of the second conductive impurities.

7. The method according to claim 1, wherein the second conductive impurities are under the shallow trench isolation region, and the first conductive impurities are under the second conductive impurities.

8. The method according to claim 1, wherein diffusing the first, second, and third impurity regions comprises heating the semiconductor substrate.

9. The method according to claim 1, comprising forming a plurality of first impurity regions by implanting the first conductive impurities into a plurality of regions in the semiconductor substrate.

10. The method according to claim 9, comprising forming a plurality of second impurity regions by implanting the second conductive impurities into the plurality of regions in the semiconductor substrate.

11. The method according to claim 10, comprising forming a plurality of third impurity regions by implanting the third conductive impurities into the plurality of regions in the semiconductor substrate.

12. The method according to claim 11, comprising forming a plurality of drift regions by diffusing the pluralities of first, second, and third conductive impurities.

13. The method according to claim 12, comprising forming the source region in a first drift region and the drain region in a second drift region by heavily implanting the fourth conductive impurities into the first and second drift regions.

14. The method according to claim 13, comprising forming a plurality of shallow trench isolation regions by selectively etching a portion of each of the first and second drift regions between the gate electrode and the source region or the drain region, and filling the etched portions with the insulation material.

* * * * *